United States Patent
Gan et al.

(10) Patent No.: US 6,478,392 B2
(45) Date of Patent: Nov. 12, 2002

(54) ENCLOSURE HAVING PIVOTABLE BEZEL

(75) Inventors: Li Yuan Gan, Shenzhen (CN); Xiao Hua Qiu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 29 days.

(21) Appl. No.: 09/749,218

(22) Filed: Dec. 27, 2000

(65) Prior Publication Data

US 2002/0060512 A1 May 23, 2002

(30) Foreign Application Priority Data

Oct. 11, 2000 (TW) ........................................ 089219481

(51) Int. Cl.⁷ .............................................. A47B 49/00
(52) U.S. Cl. ........................ 312/326; 312/223.2; 16/362
(58) Field of Search ........................... 312/223.2, 223.1, 312/311, 326, 329; 361/683, 684, 685, 724, 725, 726, 727; 16/239, 357, 359, 362

(56) References Cited

U.S. PATENT DOCUMENTS

| | | | | |
|---|---|---|---|---|
| 3,065,498 A | * | 11/1962 | Johnson | 16/359 |
| 4,418,805 A | * | 12/1983 | Wolff | 16/359 X |
| 4,683,614 A | * | 8/1987 | Anderson | 16/362 |
| 5,061,023 A | * | 10/1991 | Soubliere et al. | 312/328 |
| 5,265,954 A | * | 11/1993 | Keil | 312/326 X |
| 5,535,482 A | * | 7/1996 | Grabber | 16/362 X |
| 6,000,769 A | * | 12/1999 | Chen | 312/223.2 |
| 6,130,822 A | * | 10/2000 | Della Fiora et al. | 361/724 |
| 6,317,929 B1 | * | 11/2001 | Ring | 16/362 X |

FOREIGN PATENT DOCUMENTS

| | | | | |
|---|---|---|---|---|
| JP | 03171795 | * | 7/1991 | 361/724 |
| JP | 04157794 | * | 5/1992 | 361/724 |

* cited by examiner

*Primary Examiner*—Lanna Mai
*Assistant Examiner*—Hanh V. Tran
(74) *Attorney, Agent, or Firm*—Wei Te Chung

(57) ABSTRACT

An enclosure includes a front panel (12), a pivotable bezel (14) and a pair of female hinges (16). A pair of male hinges (42) extends from one side of an inner surface of the bezel. Each male hinge includes a flange (4220) and a pivot column (4240). Each female hinge includes a rear wall (68) attachable to the front panel, and an engaging portion (61) extending perpendicularly from the rear wall. The engaging portion defines a groove (634), and a notch (630) spaced from the groove. The groove receives the flange of the corresponding male hinge. A recess (6302) is defined at the notch, for rotatably receiving the pivot column of the corresponding male hinge. The bezel further forms a catch (44), for engaging with a slot (202) of the front panel. The bezel is thereby easily and securely attached to the front panel.

14 Claims, 5 Drawing Sheets

ENCLOSURE HAVING PIVOTABLE BEZEL

BACKGROUND OF THE INVENTION

1. Field of the Invention

The present invention relates to an enclosure having a pivotable bezel, and more particularly to an enclosure which readily and safely secures the bezel to the enclosure.

2. Related Art

Personal computers are now part of modern daily life. A personal computer generally comprises an enclosure and a bezel. The enclosure is used to accommodate a variety of components which constitute the computer. The bezel is generally attached to a front panel of the enclosure.

Generally, a bezel is attached to an enclosure with screws. During attachment or detachment of the bezel, the screws are easily dropped into the enclosure by accident. Furthermore, when a user wants to attach the bezel to the enclosure, or detach the bezel therefrom, a tool is needed. Thus, attachment or detachment of the bezel is time-consuming and laborious. Furthermore, modern compact enclosures often have only limited internal free space for accommodating tools. Therefore, during attachment or detachment of the bezel, other components of the enclosure are prone to be accidentally damaged. Thus attachment or detachment of the bezel is not only inconvenient but also unsafe.

It is therefore desired to provide an enclosure which resolves the above problems.

SUMMARY OF THE INVENTION

Accordingly, an object of the present invention is to provide an enclosure which readily and safely secures a pivotable bezel thereto.

To achieve the above object, an enclosure in accordance with the present invention comprises a front panel, a pivotable bezel and a pair of female hinges. A pair of male hinges extends from one side of an inner surface of the bezel. Each male hinge comprises a flange and a pivot column. Each female hinge comprises a rear wall attachable to the front panel, and an engaging portion extending perpendicularly from the rear wall. The engaging portion defines a groove, and a notch spaced from the groove. The groove receives the flange of the corresponding male hinge. A recess is defined at the notch, for rotatably receiving the pivot column of the corresponding male hinge. The bezel further forms a catch, for engaging with a slot of the front panel. The bezel is thereby easily and securely attached to the front panel of the enclosure.

Other objects, advantages and novel features of the present invention will be drawn from the following detailed embodiment of the present invention with attached drawings, in which:

DETAILED DESCRIPTION OF THE PREFERRED EMBODIMENT

Figure 1:
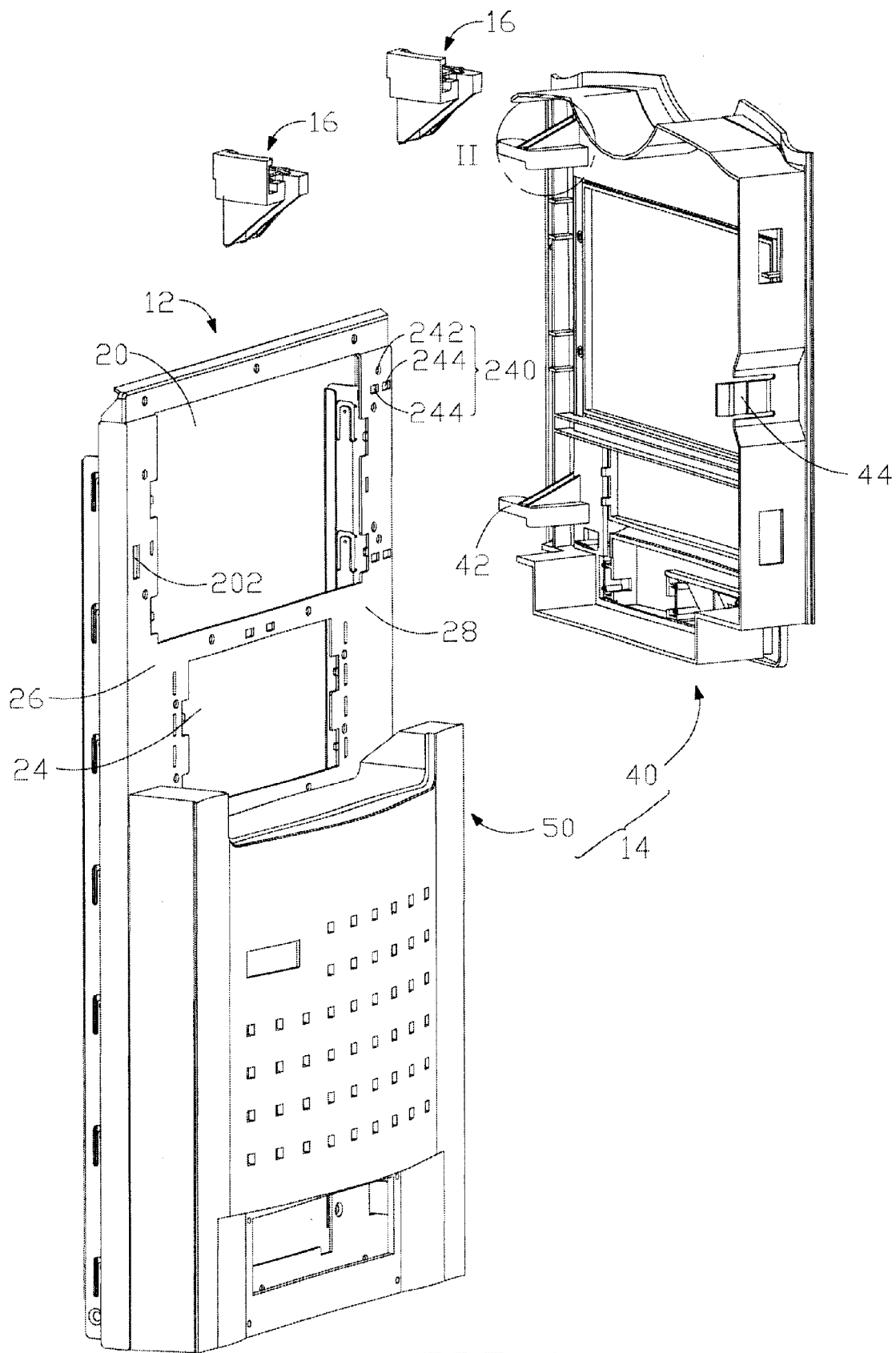
FIG. 1 an exploded view of an enclosure in accordance with the present inventor attaching a bezel to a front panel thereof.

Referring to FIG. 1, an enclosure in accordance with the present invention comprises a front panel 12, a pivotable bezel 14 and a pair of female hinges 16. The bezel 14 is secured to the front panel 12 by the female hinges 16.

The front panel 12 comprises first and second sides 26, 28. First and second openings 20, 24 are defined between the first and second sides 26, 28, for providing access to disk drives (not shown). The first opening 20 is above the second opening 24. The first side 26 of the front panel 12 defines a vertical elongate slot 202 therein. The second side 28 of the front panel 12 defines two fixing portions 240 at respective corners of the first opening 20. Each fixing portion 240 comprises a horizontally aligned pair of square holes 244, and a first screw hole 242 above the holes 244.

The bezel 14 comprises a body 40 rotatably attachable to the front panel 12, and a fixed portion 50 attached to the front panel 12 below the second opening 24. A pair of spaced male hinges 42 extends perpendicularly inwardly from one side of an inner surface of the body 40. A catch 44 extends perpendicularly inwardly from another side of the inner surface of the body 40, corresponding to the elongate slot 202 of the front panel 12.

Figure 2A:
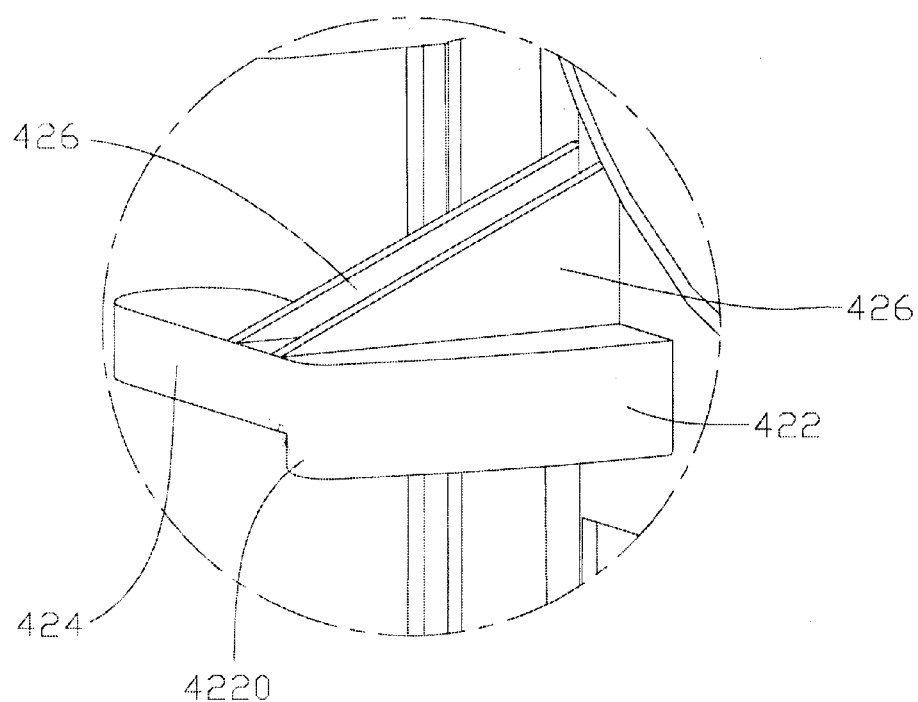
FIG. 2 an enlarged view of the circled portion II of FIG. 1.
FIG. 2B is a perspective view of the circled portion II of FIG. 1, but viewed from another angle.
Figure 2B:
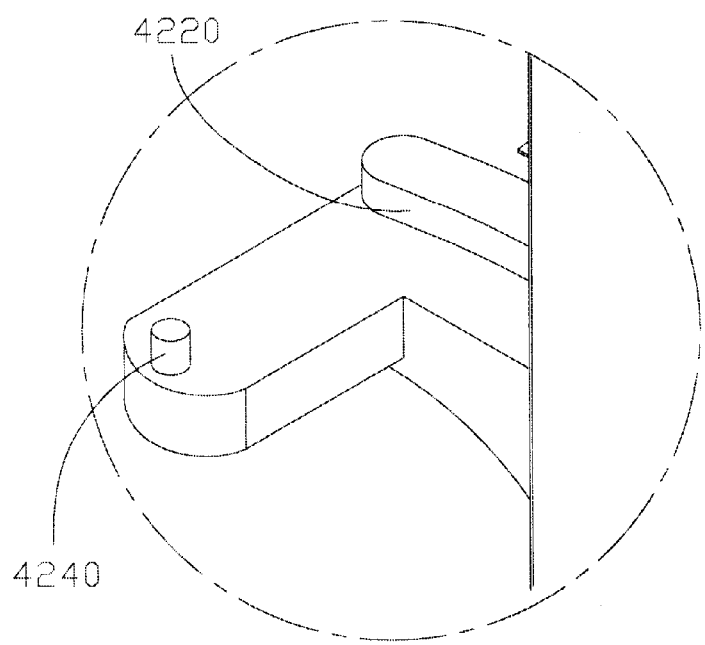

Referring also to FIGS. 2A and 2B, each male hinge 42 includes an arcuate arm 422 perpendicularly adjoining the body 40, an extending portion 424 and a pair of reinforcing ribs 426. The extending portion 424 extends from a distal end of the arcuate arm 422, substantially coplanarly with an upper surface of the extending portion 424. An arcuate flange 4220 is formed at a lower side of the arcuate arm 422. The arcuate flange 4220 and the arcuate arm 422 together define a common flank (see FIG. 2A). A pivot column 4240 is perpendicularly formed at a free end of the extending portion 424 (see FIG. 2B). The reinforcing ribs 426 extend perpendicularly from the male hinge 42, and adjoin the body 40.

Figure 3A:
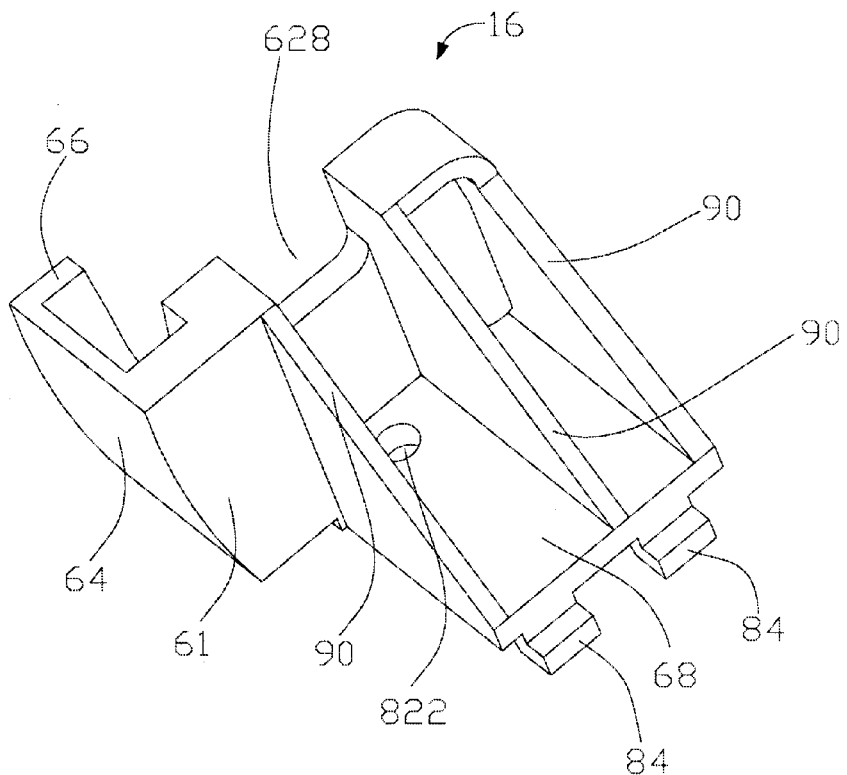
FIG. 3A is an enlarged view of a female hinge of the enclosure in accordance with the present invention.
Figure 3B:
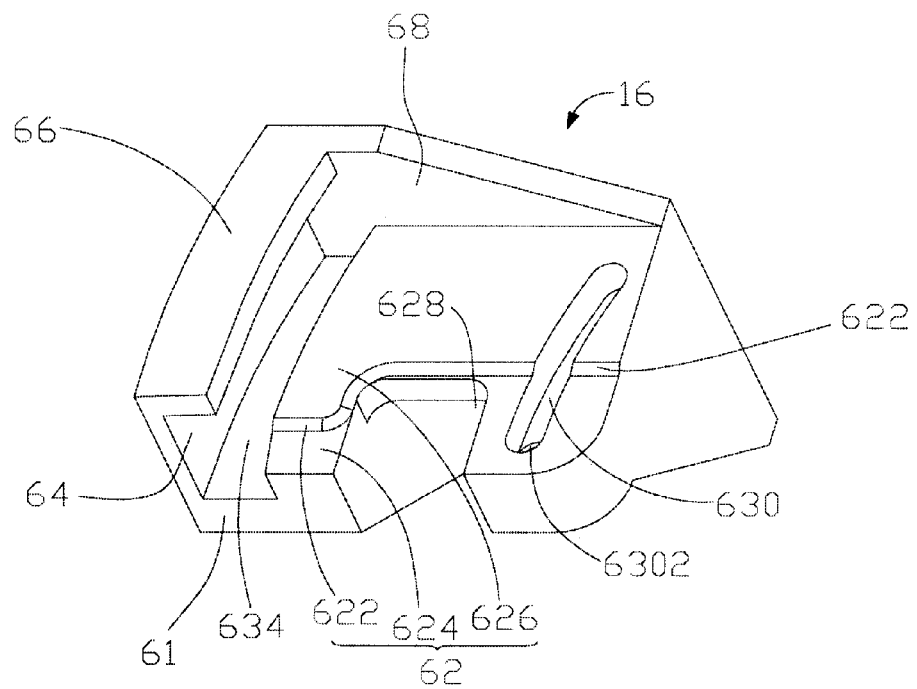
FIG. 3B similar to FIG. 3A, but viewed from another angle.

Referring also to FIGS. 3A 3B, each female hinge 16 comprises a rear wall 68 attachable to the front panel 12, and an engaging portion 61 perpendicular to the rear wall 68. The rear wall 68 defines a second screw hole 822 therein, corresponding to the first screw hole 242 of the front panel 12. A pair of spaced hooks 84 is formed at a bottom edge of the rear wall 68 below the screw hole 822, corresponding to the square holes 244 of the front panel 12.

The engaging portion 61 comprises a stepped portion 62, an arcuate side wall 64, and an arcuate sill 66. The sill 66 extends perpendicularly inwardly from an upper end of the side wall 64, with an end of the sill 66 adjoining the rear wall 68. An arcuate groove 634 is defined through the engaging portion 61 between the side wall 64 and the stepped portion 62. The groove 634 has uniform depth, but is arced in parallel with the arc of the side wall 64. The stepped portion 62 is substantially perpendicular to both the rear wall 68 and the side wall 64. The stepped portion 62 comprises a lower first planar step 624, an upper second planar step 626, and an inclined portion 622 between the first and second steps 624, 626. The first step 624 corresponds to the flange 4220 of the male hinge 42. The second step 626 is slightly higher than the first step 624, but lower than upper extremities of the rear wall 68. A cutout 628 is defined in a front edge of the first step 624. An arcuate notch 630 is defined in the stepped portion 62, at a side thereof opposite the groove 634. The notch 630 has uniform depth, but is arced substantially in parallel with the arc of the side wall 64. A recess 6302 is defined in the first step 624 beneath an outer end of the notch 630. A distance between the notch 630 and the groove 634 of the engaging portion 61 corresponds to a distance between the pivot column 4240 and the flange 4220 of the corresponding male hinge 42. Underpinning ribs 90 extend perpendicularly from the rear wall 68, and adjoin a bottom surface of the engaging portion 61.

Figure 4:
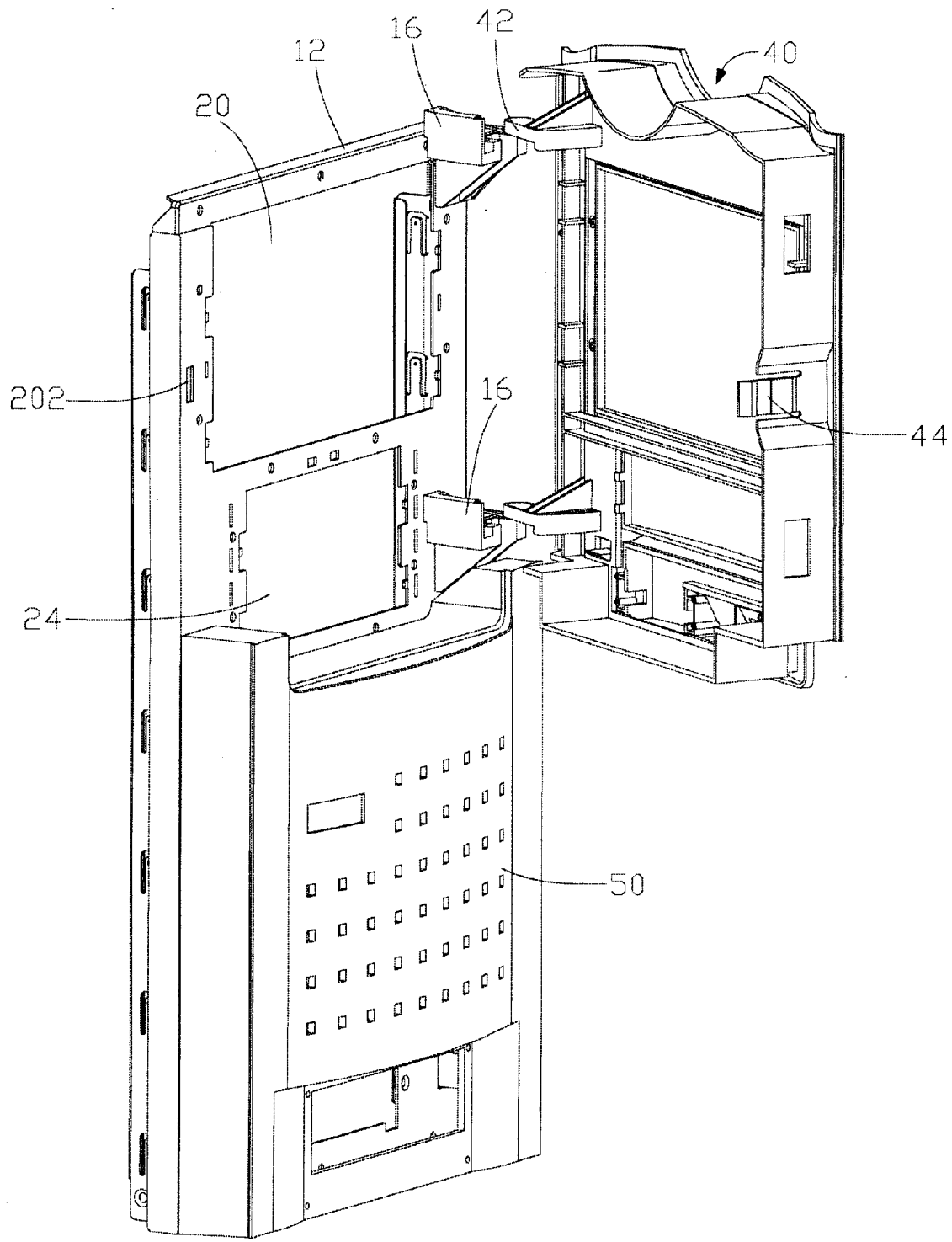
FIG. 4 is a partly assembled view of FIG. 1.
Figure 5:
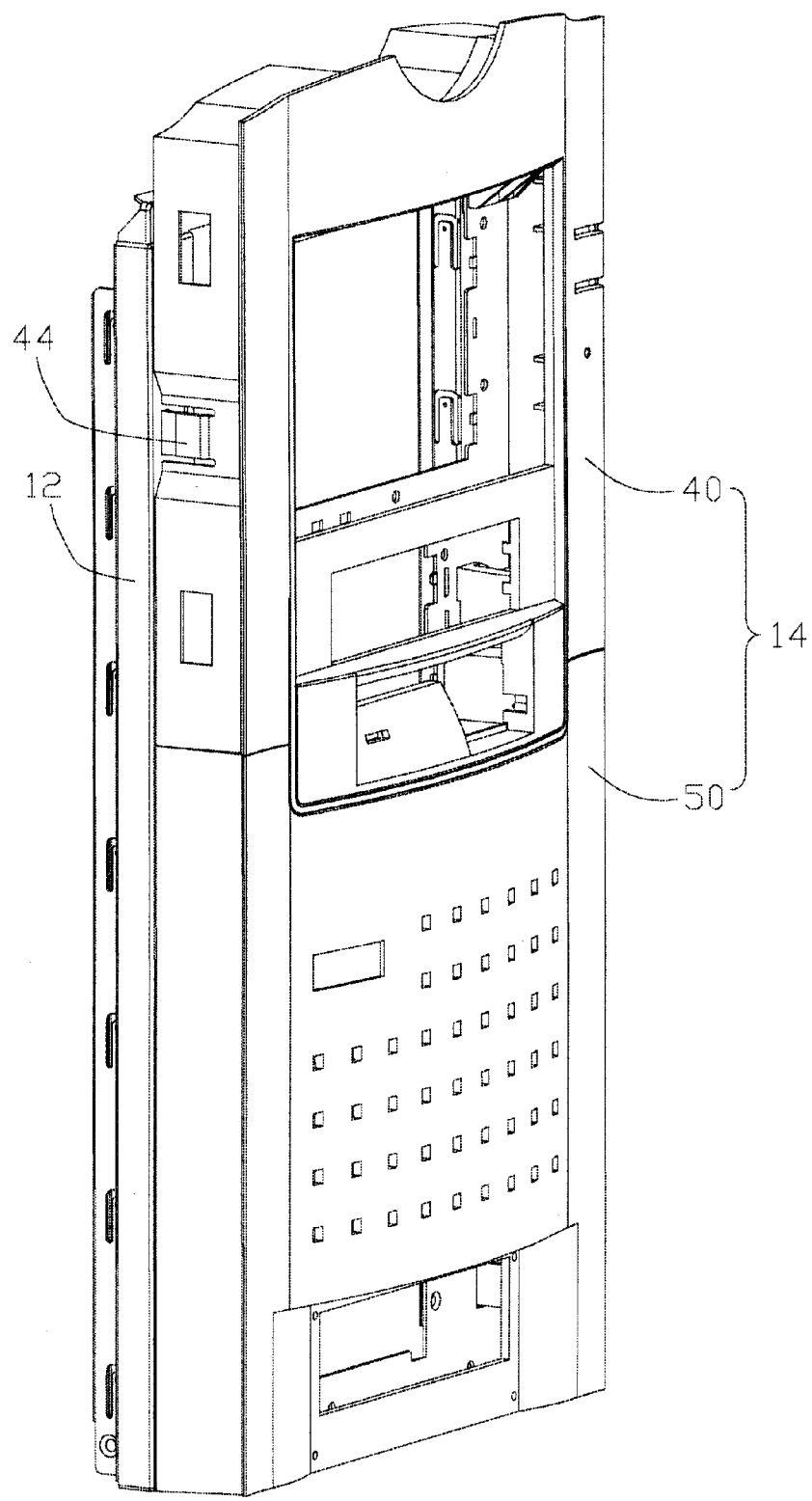
FIG. 5 is a fully assembled view of FIG. 1.

Referring to FIGS. 4 and 5, in assembly, the hooks 84 of each female hinge 16 are engaged with corresponding square holes 244 of the front panel 12. A screw (not shown) is inserted into the second screw hole 822 of each female hinge 16 and the corresponding first screw hole 242 of the front panel 12, for attaching the female hinge 16 to the front panel 12. The recesses 6302 of the female hinges 16 receive the corresponding pivot columns 4240 of the male hinges 42. The body 40 of the bezel 14 is rotated at the female hinges 16 toward the front panel 12, with the pivot columns 4240 rotating within the recesses 6302. The flanges 4220 of the male hinges 42 enter the grooves 634 of the female hinges 16, and rotation is continued until the extending portions 424 of the male hinges 42 abut the inclined portions 622 of the female hinges 16. Then the body 40 is pushed toward the front panel 12. The extending portions 424 slide over the inclined portions 622 and onto the second steps 626 of the female hinges 16. Thereupon, the flanges 4220 slide along the grooves 634, while simultaneously the pivot columns 4240 slide along the notches 630 of the female hinges 16. The sills 66 of the female hinges 16 abut upper surfaces of the male hinges 42. The extending portions 424 finally abut the rear wall 68 of the female hinges 16, and simultaneously the catch 44 of the body 40 engages with the front panel 12 at the elongate slot 202. The body 40 of the bezel 14 is thereby firmly secured to the front panel 12.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. An enclosure comprising:
   a panel defining at least one slot therein at one side thereof;
   a plurality of female hinges, each comprising a rear wall adapted to attach to the panel and an engaging portion extending from the rear wall, the engaging portion defining an arcuate groove and a notch therein; and
   a bezel having a plurality of male hinges corresponding to the female hinges and at least one catch at a respective opposite side thereof, each male hinge comprising an arcuate flange received in the arcuate groove of a corresponding one of the female hinges and a pivot column movably received in the notch of a corresponding one of the female hinges, the at least one catch engaging with the at least one slot of the panel, thereby securing the bezel to the panel;
   wherein each male hinge includes an arcuate arm extending from the bezel, an extending portion extending from a free end of the arcuate arm, and wherein the arcuate flange is formed at a lower side of the arcuate arm, and the pivot column is formed at a free end of the extending portion.

2. The enclosure as recited in claim 1, wherein the notch is arcuate.

3. The enclosure as recited in claim 2, wherein a recess is defined at an end of the notch opposite to the rear wall.

4. The enclosure as recited in claim 1, wherein the engaging portion of each female hinge further comprises a side wall and a stepped portion, with the groove of each female hinge defined in the stepped portion adjacent the side wall.

5. The enclosure as recited in claim 4, wherein a sill extends from an upper end of the side wall, for abutting an upper surface of the male hinge.

6. The enclosure as recited in claim 4, wherein the stepped portion of each female hinge comprises first and second steps and an inclined portion between the first and second steps, the extending portion of the corresponding male hinge sliding over the stepped portion thereby allowing the groove of each female hinge to receive the flange of the corresponding male hinge.

7. The enclosure as recited in claim 1, wherein the rear wall of each female hinge comprises at least one hook for engaging with a corresponding hole defined in the panel.

8. The enclosure as recited in claim 1, wherein the rear wall of each female hinge defines a screw hole therein corresponding to a screw hole defined in the panel, a screw being inserted into the said screw holes for securing each female hinge to the panel.

9. The enclosure as recited in claim 1, wherein each male hinge further comprises at least one reinforcing rib.

10. The enclosure as recited in claim 1, wherein each female hinge further comprises at least one underpinning rib, for reinforcing the female hinge.

11. An enclosure comprising: a panel;
   a bezel moveable relative to the panel along a non-linear path;
   a first hinge device disposed around a first side edge section of said panel;
   a second hinge device disposed around a first side edge section of said bezel corresponding to said first side edge section of the panel;
   an arcuate groove defined in one of said panel and said bezel;
   an arcuate Range defined on the other of said panel and said bezel and
   compliantly receiveably moveable in said arcuate groove;
   an arcuate notch located beside a combination of said arcuate groove and said arcuate flange, and defined in one of said panel and said bezel;
   a pivot column formed beside the combination of said arcuate groove and said arcuate flange, and defined on the other of said panel and said bezel, said pivot column being compliantly receiveably moveable in said arcuate notch; and a recess communicatively formed around an outer end of said arcuate notch and compliantly receiving said pivot column therein when said pivot column is moved thereto so as to allow said bezel to be detached from the panel first along said non-linear path outwardly and successively rotated about an axis of said recess sideward without interference between said panel and said bezel around the side edge sections of said panel and bezel.

12. The enclosure as recited in claim 11, wherein a catch is formed on a second edge section of one of said panel and said bezel opposite to said first side edge sections of said panel and said bezel;

13. The enclosure as recited in claim 11, wherein said arcuate groove and said arcuate notch define convex contours away from the first side edge sections.

14. The enclosure as recited in claim 11, wherein said arcuate groove is essentially located on an outer side of said arcuate notch.

* * * * *